United States Patent
Wang et al.

(10) Patent No.: US 9,647,007 B2
(45) Date of Patent: May 9, 2017

(54) DUAL-GATE ARRAY SUBSTRATE, DISPLAY PANEL AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Lei Wang, Beijing (CN); Chong Fang, Beijing (CN); Jiayuan Yang, Beijing (CN); Jian Zhang, Beijing (CN); Xuezhu Wang, Beijing (CN); Yanbo Chen, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/162,714

(22) Filed: May 24, 2016

(65) Prior Publication Data
US 2016/0372495 A1    Dec. 22, 2016

(30) Foreign Application Priority Data

Jun. 18, 2015 (CN) .......................... 2015 1 0341128

(51) Int. Cl.
*H01L 27/12*    (2006.01)
*H01L 27/146*   (2006.01)
*H04N 19/182*   (2014.01)
*H01L 27/32*    (2006.01)

(52) U.S. Cl.
CPC ...... *H01L 27/1244* (2013.01); *H01L 27/1463* (2013.01); *H01L 27/326* (2013.01); *H04N 19/182* (2014.11)

(58) Field of Classification Search
CPC .................................................. H01L 27/1244
See application file for complete search history.

(56) References Cited

U.S. PATENT DOCUMENTS

2014/0070221 A1*  3/2014  Li ..................... H01L 29/78669
                                                          257/59

* cited by examiner

*Primary Examiner* — Moazzam Hossain
*Assistant Examiner* — Farun Lu
(74) *Attorney, Agent, or Firm* — Banner & Witcoff, Ltd.

(57) ABSTRACT

A dual-gate array substrate, a display panel and a display device are provided. The dual-gate array substrate includes a plurality of pixel unit pairs arranged in an array, every pixel unit pair including a first pixel unit and a second pixel unit, and the first pixel unit and the second pixel unit sharing a data line disposed there-between; a common electrode line disposed between every two adjacent pixel unit pairs in a row direction; a first strip structure disposed between the first pixel unit and the data line; a second strip structure disposed between the second pixel unit and the data line; and a first cross structure, a second cross structure and an intermediate cross structure electrically connecting the first strip structure to the second strip structure. The first cross structure and the second cross structure are disposed at two sides of the intermediate cross structure, respectively.

20 Claims, 2 Drawing Sheets

DUAL-GATE ARRAY SUBSTRATE, DISPLAY PANEL AND DISPLAY DEVICE

This application claims priority to and the benefit of Chinese Patent Application No. 201510341128.9 filed on Jun. 18, 2015, which application is incorporated herein in its entirety.

TECHNICAL FILED

Embodiments of the present disclosure relate to dual-gate array substrate, a display panel and a display device.

BACKGROUND

An array data failure is often occurred during a manufacture process of array substrate products, and it usually utilizes a thermal effect of tungsten powders to perform bridge connection with laser for a repair. The repair requires arranging and welding a repair line, which is complicated in operation and also very likely to cause pixel regions to be covered or even damages pixel electrodes, resulting in the occurrence of continuous bright spots. Therefore, a data line repair of the array substrates is liable to lead to a pixel failure.

SUMMARY

Embodiments of the present disclosure provide a dual-gate array substrate, a display panel and a display device. Embodiments of the present disclosure provide technical solutions as below.

A dual-gate array substrate, including a plurality of pixel units arranged in an array, wherein a first gate line and a second gate line are disposed in parallel between every two adjacent rows of pixel units, every row of pixel units includes a plurality of pixel unit pairs, every pixel unit pair includes a first pixel unit and a second pixel unit, and the first pixel unit and the second pixel unit share a data line disposed there-between.

The dual-gate array substrate further includes: a common electrode line disposed between every two adjacent pixel unit pairs in a row direction; a first strip structure disposed between the first pixel unit and the data line, and a second strip structure disposed between the second pixel unit and the data line; the first strip structure being electrically connected to a common electrode line disposed at one side of the first pixel unit facing away the second pixel unit, and the second strip structure being electrically connected to a common electrode line disposed at one side of the second pixel unit facing away the first pixel unit; and a first cross structure electrically connected one end of the first strip structure to one end of the second strip structure, a second cross structure electrically connected the other end of the first strip structure to the other end of the second strip structure, and an intermediate cross structure disposed between the first cross structure and the second cross structure to electrically connect the first strip structure to the second strip structure.

A thin film transistor of the first pixel unit is connected to the first gate line disposed at one side of the pixel unit pair, and a thin film transistor of the second pixel unit is connected to the second gate line disposed at the other side of the pixel unit pair.

Along a direction of the first gate line directing to the second gate line, each of the first strip structure and the second strip structure includes a first portion, an intermediate portion and a second portion successively. The second portion of the first strip structure is electrically connected to a common electrode line disposed at one side of the first pixel unit facing away the second pixel unit, and the first portion of the second strip structure is electrically connected to a common electrode line disposed at one side of the second pixel unit facing away the first pixel unit. Two ends of the first cross structure are connected to the first portion of the first strip structure and the first portion of the second strip structure, respectively. Two ends of the second cross structure are connected to the second portion of the first strip structure and the second portion of the second strip structure, respectively. Two ends of the intermediate cross structure are connected to the intermediate portion of the first strip structure and the intermediate portion of the second strip structure, respectively.

In the first strip structure, a cutting groove is disposed between the intermediate portion and the first portion, and a cutting groove is disposed between the intermediate portion and the second portion.

In the second strip structure, a cutting groove is disposed between the intermediate portion and the first portion, and a cutting groove is disposed between the intermediate portion and the second portion.

The second portion of the first strip structure and a common electrode line disposed at one side of the first pixel unit facing away the second pixel unit are electrically connected through a first connection structure extending along an edge of the first pixel unit. The first portion of the second strip structure and a common electrode line disposed at one side of the second pixel unit facing away the first pixel unit are electrically connected through a second connection structure extending along an edge of the second pixel unit.

A cutting groove is disposed between the second portion of the first strip structure and the first connection structure. A cutting groove is disposed between the first portion of the second strip structure and the second connection structure.

The dual-gate array substrate further includes: a third cross structure configured to electrically connect two adjacent common electrode lines between two adjacent rows of pixel units.

The first strip structure, the second strip structure, the first connection structure, the second connection structure, the intermediate cross structure and the common electrode line are integrally formed in a same layer.

The first cross structure, the second cross structure and the third cross structure are disposed in a same layer.

The first strip structure, the second strip structure, the first connection structure, the second connection structure, the intermediate cross structure and the common electrode line are formed by using a metallic material.

The first cross structure, the second cross structure and the third cross structure are formed by using indium tin oxide (ITO) material.

Embodiments of the present disclosure further provide a display panel including the dual-gate array substrate in any of the technical solutions above.

Embodiments of the present disclosure further provide a display device including the display panel in any of the technical solutions above.

BRIEF DESCRIPTION OF THE DRAWINGS

Embodiments of the present disclosure will be described in more detail as below in conjunction with the accompanying drawings to enable those skilled in the art to understand the present disclosure more clearly, wherein.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

The inventor has noticed that designing an array substrate that enables convenient data line repair and reduces impact to pixel unit during the data line repair is important in improving market competitiveness and obtaining excellent user experience.

Figure 1:
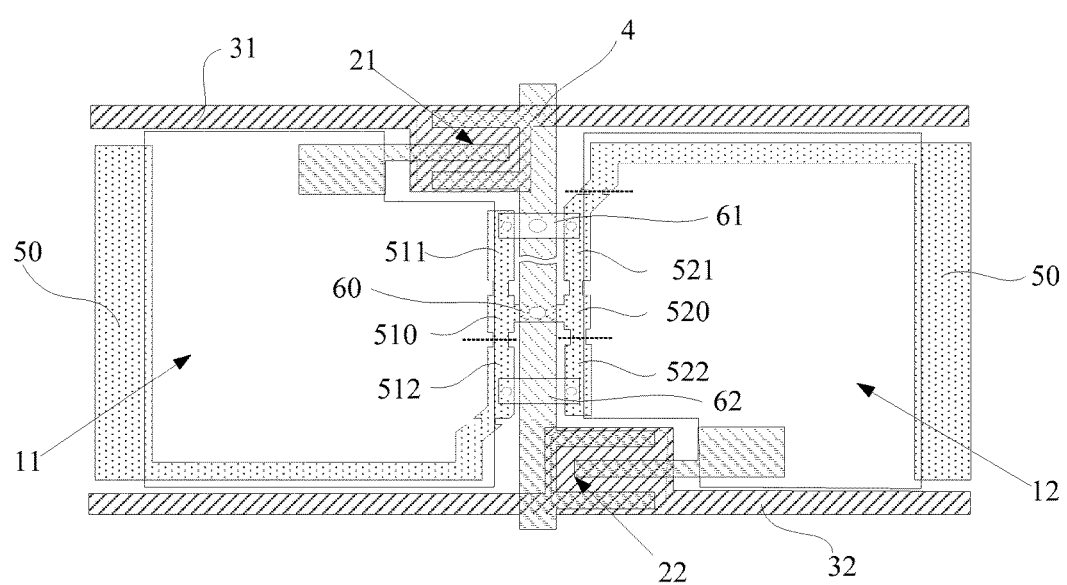
FIG. 1 is a schematic diagram illustrating part of a dual-gate array substrate as provided by an embodiment of the present disclosure.
Figure 2:
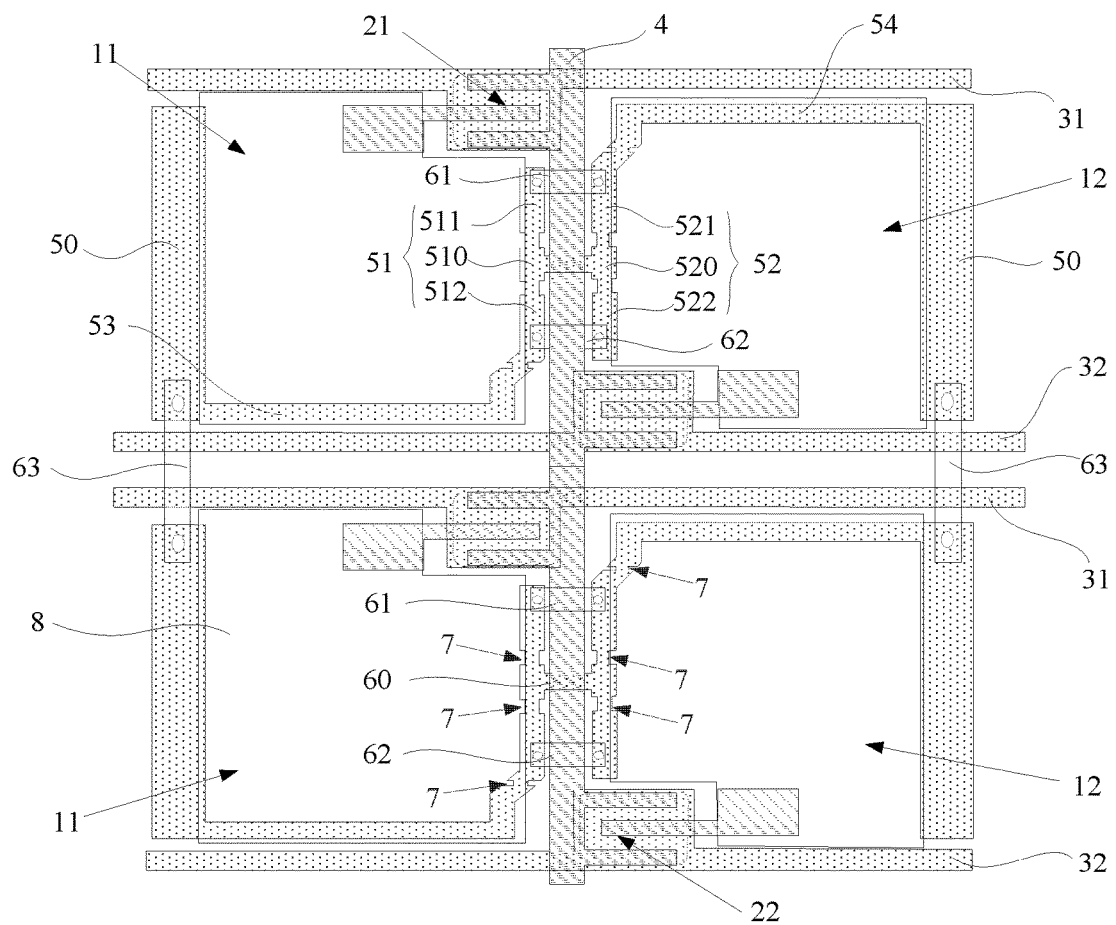
FIG. 2 is a schematic diagram illustrating part of a dual-gate array substrate as provided by another embodiment of the present disclosure.

Hereinafter embodiments of the present disclosure are described in conjunction with the drawings. As illustrated in FIG. 1 and FIG. 2, the dual-gate array substrate as provided by embodiments of the present disclosure enables convenient and easily achievable data line repair and also can reduce impact to pixel unit during the data line repair.

According to the embodiments, the dual-gate array substrate includes a plurality of pixel units arranged in an array, wherein a first gate line 31 and a second gate line 32 are disposed in parallel between every two adjacent rows of pixel units; every row of pixel units includes a plurality of pixel unit pairs, every pixel unit pair includes a first pixel unit 11 and a second pixel unit 12, and the first pixel unit 11 and the second pixel unit 12 share a data line 4 disposed there-between.

FIG. 2 illustrates two pixel unit pairs disposed at two rows of pixel units. For clarity of reference numerals, some components or portions are labeled in one pixel unit pair, while some are labeled in the other pixel unit.

The dual-gate array substrate further includes: a common electrode line 50 disposed between every two adjacent pixel unit pairs in a row direction; a first strip structure 51 disposed between the first pixel unit 11 and the data line 4, and a second strip structure 52 disposed between the second pixel unit 12 and the data line 4. The first strip structure 51 is electrically connected to a common electrode line 50 disposed at one side of the first pixel unit 11 facing away the second pixel unit 12, and the second strip structure 52 is electrically connected to a common electrode line 50 disposed at one side of the second pixel unit 12 facing away the first pixel unit 11; a first cross structure 61 electrically connected one end of the first strip structure 51 to one end of the second strip structure 52; a second cross structure 62 electrically connected the other end of the first strip structure 51 to the other end of the second strip structure 52; and an intermediate cross structure 60 disposed between the first cross structure 61 and the second cross structure 62 to electrically connect the first strip structure 51 to the second strip structure 52.

In the dual-gate array substrate, the first strip structure 51, the second strip structure 52, and the three cross structures (the first cross structure 61, the second cross structure 62 and the intermediate cross structure 60) that connect the first strip structure 51 to the second strip structure 52 all have electrical connection relations with the data line 4, and can be used as common electrode to increase a storage capacitance between the common electrode and the pixel electrode. Furthermore, when an open circuit or broken is occurred in an area of the data line located between the first strip structure 51 and the second strip structure 52 in the pixel unit pair, the first strip structure 51, the second strip structure 52 and the three cross structures can also be used as repair lines to repair the data line 4. For example, in the case where an open circuit is occurred in an area of the data line 4 located between the first cross structure 61 and the intermediate cross structure 60, by disconnecting (as illustrated in FIG. 1, cutting off along three dash lines) both of a portion of the first strip structure 51 and a portion of the second strip structure 52 that are located between the first cross structure 61 and the intermediate cross structure 60 from the common electrodes 50 disposed at both sides of the pixel unit, that is, by removing the electrical connection there-between, the first cross structure 61, the intermediate cross structure 60, the portion of the first strip structure 51 located between the first cross structure 61 and the intermediate cross structure 60, and the portion of the second strip structure 52 located between the first cross structure 61 and the intermediate cross structure 60 can be used as repair lines for the data line 4. Under this circumstance, by electrically connecting the first cross structure 61 and the intermediate cross structure 60 respectively to the data line 4 (e.g., by welding respective areas of the two cross structures overlapped with the data line 4 together), it can realize a closed circuit in the data line 4 so as to achieve a repair of the data line 4. During the repair above, by cutting off the connection between the respective portions and by welding the respective areas of the two cross structures overlapped with the data line 4 together, it can realize re-connecting. As a result, the repair procedure is simple in operation and not likely to cause pixel regions to be covered or damaged. The dual-gate array substrate above enables convenient data line repair and reduces the impact to the pixel unit during the data line repair.

In addition, among the first strip structure 51, the second strip structure 52 and the three cross structures for use in data line repair, only the three cross structures bridging two sides of the data line 4 have areas overlapped with the data line 4; as a result, when the first strip structure 51, the second strip structure 52 and the three cross structures are used as a common electrode, they are not liable to contact the data line, and are not likely to result in an occurrence of a short circuit in the data line 4 or the common electrode line 51.

Referring back to FIG. 1 and FIG. 2, in an embodiment, a thin film transistor 21 of the first pixel unit 11 is connected to the first gate line 31 disposed at one side of the pixel unit pair, and a thin film transistor 22 of the second pixel unit 12 is connected to the second gate line 32 disposed at the other side of the pixel unit pair.

Along a direction of the first gate line 31 directing to the second gate line 32, each of the first strip structure 51 and the second strip structure 52 includes a first portion, an intermediate portion and a second portion successively.

The second portion 512 of the first strip structure 51 is electrically connected to a common electrode line 50 disposed at one side of the first pixel unit 11 facing away the second pixel unit 12, and the first portion 521 of the second strip structure 52 is electrically connected to a common electrode line 50 disposed at one side of the second pixel unit 12 facing away the first pixel unit 11. That is, as illustrated in FIG. 1 and FIG. 2, the first strip structure 51 is electrically connected to the common electrode line 51 by the end of the first strip structure 50 far away from the thin film transistor 21 thereof, and the second strip structure 52 is electrically connected to the common electrode line 50 by the end of the second strip structure 52 far away from the thin film transistor 22 thereof. As a result, a connection structure between the first strip structure 51 and the common electrode line 50, and a connection structure between the second strip structure 52 and the common electrode line 50, can extend along an edge of the pixel unit, respectively, so as to avoid any impact to the aperture ratio of the array substrate.

Two ends of the first cross structure 61 are connected to the first portion 511 of the first strip structure 51 and to the first portion 521 of the second strip structure 52, respectively. Two ends of the second cross structure 62 are connected to the second portion 512 of the first strip structure 51 and to the second portion 522 of the second strip structure 52, respectively. Two ends of the intermediate cross structure 60 are connected to the intermediate portion 510 of the first strip structure 51 and to the intermediate portion 520 of the second strip structure 52, respectively.

In the dual-gate array substrate, as illustrated in FIG. 1, when an open circuit is occurred in an area of the data line 4 located between the first cross structure 61 and the intermediate cross structure 60, by cutting off (as illustrated in FIG. 1, by cutting off (along three dash lines in FIG. 1) the connection between the intermediate portion 510 and the second portion 512 of the first strip structure 51, the connection between the intermediate portion 502 and the second portion 522 of the second strip structure 52, and the connection between the first portion 521 of the second strip structure 52 and the common electrode 50 connected thereto. That is, by removing the electrical connection there-between, the first portion 511 of the first strip structure 51, the first portion 521 of the second strip structure 52, and the first cross structure 61 and the intermediate cross structure 60, the electrical connection between them and the common electrode lines 50 at both sides of the pixel unit pair can be removed, to allow them being used as repair lines for the data line 4. Under such circumstance, by electrically connecting the first cross structure 61 and the intermediate cross structure 60 respectively to the data line 4, it can realize a closed circuit in the data line 4 so as to repair the data line 4. As illustrated in FIG. 1, the electrical connections above can be realized by welding respective areas of the first cross structure 61 and the intermediate cross structure 60 that are overlapped with the data line 4 together. Likewise, when an open circuit is occurred in an area of the data line 4 located between the second cross structure 62 and the intermediate cross structure 60, the second portion 512 of the first strip structure 51, the second portion 522 of the second strip structure 52, the second cross structure 62 and the intermediate cross structure 60 can be used as repair lines for the data line 4. The repair can be done by removing their electrical connection relations with the common electrode lines 50 located at both sides of the pixel unit pair and then welding respective areas of the second cross structure 62 and the intermediate cross structure 60 that are overlapped with the data line 4 together. The repair is realized by cutting off three connection and welding respective areas of two cross structures overlapped with the data line 4 together, which is simple in operation and is not likely to cause pixel regions to be covered or damaged. Therefore, the dual-gate array substrate above enables convenient data line repair and reduces the impact to the pixel unit during the data line repair.

In the dual-gate array substrate, considering a data line area located between two thin film transistors is almost entirely located between the first cross structure 61 and the second cross structure 62, almost all the open circuits occurred in the data line area located between two thin film transistors in the pixel unit pair can be repaired.

As illustrated in FIGS. 1-2 and on the basis of the foregoing embodiments, in an embodiment, in the first strip structure 51, a cutting groove 7 is disposed between the intermediate portion 510 and the first portion 511, and it is also disposed between the intermediate portion 510 and the second portion 512. In the second strip structure 52, the cutting groove 7 can also be disposed between the intermediate portion 520 and the first portion 521, and be disposed between the intermediate portion 520 and the second portion 522.

During the data line repair, it needs to cut off a joint between two adjacent portions of the first strip structure 51 and a joint between two adjacent portions of the second strip structure 52; by arranging the cutting groove 7 at respective joints between respective portions of the first strip structure 51 and at respective joints between respective portions of the second strip structure 52, a size of each of the joints between respective portions along a cutting direction can be reduced; as a result, the joints can be easily cut off when cutting along the cutting groove 7. Due to a cutting groove 7 being disposed at a joint, the joint corresponding to a position where a cutting process is required to be performed can be readily found through the cutting groove 7; especially when the dual-gate array substrate in the embodiments of the present disclosure has been assembled for a display device, a correct cutting position can be readily found through the cutting groove 7 even in a multi-layered structure of the display device. Therefore, during the repair of the data line 4, the cutting position can be readily found through the cutting groove 7, and it is readily to cut off two sides of the cutting position of the strip structures.

As illustrated in FIGS. 1-2 and on the basis of the foregoing embodiments, in an embodiment, the second portion 512 of the first strip structure 51 and a common electrode line 50 disposed at one side of the first pixel unit 11 facing away the second pixel unit 12 can be electrically connected through a first connection structure 53 extending along an edge of the first pixel unit 11. The first portion 521 of the second strip structure 52 and a common electrode line 50 disposed at one side of the second pixel unit 12 facing away the first pixel unit 11 can be electrically connected through a second connection structure 54 extending along an edge of the second pixel unit 12.

In the foregoing embodiments, the first strip structure 51, the second strip structure 52 and the common electrode line 50 all extend along an edge of the pixel unit region;

moreover, the first connection structure 53 and the second connection structure 54 in the present embodiment also extend along an edge of the pixel unit region; as a result, the first strip structure 51, the second strip structure 52, the first connection structure 53, the second connection structure 54 and the common electrode line 50 in the embodiments of the present disclosure can be made by using a metallic material, and will have minor impact to the aperture ratio of the dual-gate array substrate because they are disposed at edge locations.

As illustrated in FIGS. 1-2 and on the basis of the foregoing embodiments, in an embodiment, between the second portion 512 of the first strip structure 51 and the first connection structure 53, a cutting groove 7 is disposed; and between the first portion 521 of the second strip structure 52 and the second connection structure 54, a cutting groove 7 is disposed.

By arranging a cutting groove 7 at a joint between the second portion 512 of the first strip structure 51 and the first connection structure 53, and at a joint between the first portion 521 of the second strip structure 52 and the second connection structure 54, these joints can be readily cut off by cutting along the cutting groove 7, which makes it also easy to remove the connection at both sides of the joints. In addition, because a cutting groove 7 is disposed at a joint, the joint corresponding to a position where a cutting process is required to be performed can be readily found through the cutting groove 7. Therefore, during the repair of the data line 4, the cutting position between the first strip structure 51 and the first connection structure 53, and/or, the cutting position between the second strip structure 52 and the second connection structure 54 can be readily found, which makes it easy to cut off both sides of the cutting position.

As illustrated in FIG. 2 and on the basis of the foregoing embodiments, in an embodiment, the dual-gate array substrate can further include: a third cross structure 63 configured to electrically connect two adjacent common electrode lines 50 located between two adjacent rows of pixel units.

As illustrated in FIG. 2, the first cross structure 61 and the second cross structure 62 are electrically connected to the common electrode lines 50 disposed at left and right side of the pixel unit pair, respectively, the common electrode lines 50 in every row of pixel units can be interconnected through the intermediate cross structure 60, the first cross structure 61 and the second cross structure 62, that is, the common electrode lines 50 can be interconnected in a row direction; while the common electrode lines 50 in different rows can be interconnected through the third cross structure 63, that is, the common electrode lines 50 can be interconnected in a column direction. As a result, the common electrode lines 50 in the dual-gate array substrate of the embodiments of the present disclosure can be interconnected like a net by the intermediate cross structure 60, the first cross structure 61, the second cross structure 62 and the third cross structure 63. As above, the intermediate cross structure 60, the first cross structure 61, the second cross structure 62 and the third cross structure 63 can increase the storage capacitance of the array substrate, and maintain an electrical connection between two adjacent common electrode lines 50 in a certain row of pixel units by other connection links even a direct connection between these two common electrode lines 50 has been cut off for repairing the data line 4. Therefore, the repair of the data line 4 will not impact a switching function of the dual-gate array substrate in the embodiments of the present disclosure. For example, a number of the third cross structure 63 can allow every two adjacent common electrode lines 50 located between two adjacent rows of pixel units as illustrated in FIG. 2 being electrically connected through the third cross structure 63, or can allow forming a third cross structure between every two adjacent common electrode lines 50 in every other certain columns of pixel units. But the present disclosure is not limited thereto.

As illustrated in FIGS. 1-2 and on the basis of the foregoing embodiments, in an embodiment, the first strip structure 51, the second strip structure 52, the first connection structure 53, the second connection structure 54, the intermediate cross structure 60 and the common electrode line 50 can be integrally formed in a same layer. During making the dual-gate array substrate of embodiments of the present disclosure, it's possible to form a common electrode layer firstly, and then form patterns of the first strip structure 51, the second strip structure 52, the first connection structure 53, the second connection structure 54, the intermediate cross structure 60 and the common electrode line 50 by a patterning process. In other words, the first strip structure 51, the second strip structure 52, the first connection structure 53, the second connection structure 54, the intermediate cross structure 60 and the common electrode line 50 are all common electrode patterns and all can be used for forming a storage capacitance with a pixel electrode 8.

As illustrated in FIG. 2, for example, the first strip structure 51, the second strip structure 52, the first connection structure 53, the second connection structure 54, the intermediate cross structure 60 and the common electrode line 50 can be made by using a metallic material, and can be disposed in a same layer with the gate line.

As illustrated in FIG. 2 and on the basis of the foregoing embodiments, in an embodiment, the first cross structure 61, the second cross structure 62 and the third cross structure 63 can be disposed in a same layer.

As illustrated in FIG. 2, for example, the first cross structure 61, the second cross structure 62 and the third cross structure 63 can be made by using indium tin oxide (ITO) material, and can be disposed in a same layer with the pixel electrode 8.

In the dual-gate array substrate above, the first strip structure, the second strip structure, as well as the cross structure connecting the first strip structure and the second strip structure can be used as a common electrode to increase the storage capacitance between the common electrode and the pixel electrode. When an open circuit in occurred in an area of the data line located between the first strip structure and the second strip structure in the pixel unit pair, the first strip structure, the second strip structure and the cross structure can also be used as repair lines for repairing the data line. For example, in the case where an open circuit is occurred in an area of the data line 4 located between the first cross structure and the intermediate cross structure, by disconnecting the first strip structure and the second strip structure located between the first cross structure and the intermediate cross structure from the common electrodes located at both sides of the pixel unit pair, that is, by removing the electrical connection there-between, the first cross structure, the intermediate cross structure, a portion of the first strip structure located between the first cross structure and the intermediate cross structure, and a portion of the second strip structure located between the first cross structure and the intermediate cross structure can be used as repair lines for the data line. Under such circumstance, it can realize a closed circuit in the data line so as to repair the data line by electrically connecting the first cross structure and the intermediate cross structure, respectively, to the data line (e.g., by welding the respective areas of the two cross structures overlapped with the data line together). During the repair, by cutting off the connection between the respective portions and welding the areas of the two cross structures overlapped with the data line together, the repair can be accomplished. The repair procedure is simple in operation and is not likely to cause pixel regions to be covered or damaged. Therefore, the dual-gate array substrate enables convenient data line repair and can reduce the impact to the pixel unit during the data line repair.

In addition, among the first strip structure, the second strip structure and the three cross structures used in the data line repair, only the three cross structures bridging two sides of the data line have areas overlapped with the data line; as a result, when the first strip structure, the second strip structure and the three cross structures are used as a common electrode, they are not liable to contact the data line and are not likely to cause an occurrence of a short circuit in the data line or the common electrode line.

Embodiments of the present disclosure also provide a display panel including the dual-gate array substrate in any of the embodiments above. The display panel can enable convenient data line repair and reduce the impact to the pixel unit during the data line repair.

Embodiments of the present disclosure also provide a display device including the display panel in any of the embodiments above. The display device can enable convenient data line repair and reduce the impact to the pixel unit during the data line repair.

It is understood that the described above are just exemplary embodiments to explain the principle of the present disclosure and the disclosure is not intended to be limited thereto. An ordinary person in the art can make various variations and modifications to the present disclosure without departure from the spirit and the scope of the present disclosure, and such variations and modifications shall fall in the scope of the present disclosure.

The present application claims the priority of Chinese patent application No. 201510341128.9 filed on Jun. 18, 2015 and entitled "A Dual-Gate Array Substrate, a Display Panel and a Display Device", which is incorporated herein by reference entirely.

What is claimed is:

1. A dual-gate array substrate, comprising:
a plurality of pixel units arranged in an array, wherein a first gate line and a second gate line are disposed in parallel between every two adjacent rows of pixel units, every row of pixel units includes a plurality of pixel unit pairs, every pixel unit pair includes a first pixel unit and a second pixel unit, and the first pixel unit and the second pixel unit share a data line disposed therebetween;
a common electrode line disposed between every two adjacent pixel unit pairs in a row direction;
a first strip structure disposed between the first pixel unit and the data line, and a second strip structure disposed between the second pixel unit and the data line; wherein the first strip structure is electrically connected to a common electrode line disposed at one side of the first pixel unit facing away the second pixel unit, and the second strip structure is electrically connected to a common electrode line disposed at one side of the second pixel unit facing away the first pixel unit; and
a first cross structure electrically connected one end of the first strip structure to one end of the second strip structure, a second cross structure electrically connected the other end of the first strip structure to the other end of the second strip structure, and an intermediate cross structure disposed between the first cross structure and the second cross structure to electrically connect the first strip structure to the second strip structure.

2. The dual-gate array substrate of claim 1, wherein a thin film transistor of the first pixel unit is connected to the first gate line disposed at one side of the pixel unit pair, and a thin film transistor of the second pixel unit is connected to the second gate line disposed at the other side of the pixel unit pair;
along a direction of the first gate line directing to the second gate line, each of the first strip structure and the second strip structure includes a first portion, an intermediate portion and a second portion successively;
wherein the second portion of the first strip structure is electrically connected to a common electrode line disposed at one side of the first pixel unit facing away the second pixel unit, and the first portion of the second strip structure is electrically connected to a common electrode line disposed at one side of the second pixel unit facing away the first pixel unit; two ends of the first cross structure are connected to the first portion of the first strip structure and the first portion of the second strip structure, respectively; two ends of the second cross structure are connected to the second portion of the first strip structure and the second portion of the second strip structure, respectively; and two ends of the intermediate cross structure are connected to the intermediate portion of the first strip structure and the intermediate portion of the second strip structure, respectively.

3. The dual-gate array substrate of claim 2, wherein in the first strip structure, a cutting groove is disposed between the intermediate portion and the first portion, and a cutting groove is disposed between the intermediate portion and the second portion.

4. The dual-gate array substrate of claim 3, wherein in the second strip structure, a cutting groove is disposed between the intermediate portion and the first portion, and a cutting groove is disposed between the intermediate portion and the second portion.

5. The dual-gate array substrate of claim 2, wherein the second portion of the first strip structure and a common electrode line disposed at one side of the first pixel unit facing away the second pixel unit are electrically connected through a first connection structure extending along an edge of the first pixel unit.

6. The dual-gate array substrate of claim 5, wherein the first portion of the second strip structure and a common electrode line disposed at one side of the second pixel unit facing away the first pixel unit are electrically connected through a second connection structure extending along an edge of the second pixel unit.

7. The dual-gate array substrate of claim 3, wherein the second portion of the first strip structure and a common electrode line disposed at one side of the first pixel unit facing away the second pixel unit are electrically connected through a first connection structure extending along an edge of the first pixel unit.

8. The dual-gate array substrate of claim 7, wherein the first portion of the second strip structure and a common electrode line disposed at one side of the second pixel unit facing away the first pixel unit are electrically connected through a second connection structure extending along an edge of the second pixel unit.

9. The dual-gate array substrate of claim 4, wherein the second portion of the first strip structure and a common electrode line disposed at one side of the first pixel unit facing away the second pixel unit are electrically connected through a first connection structure extending along an edge of the first pixel unit.

10. The dual-gate array substrate of claim 9, wherein the first portion of the second strip structure and a common electrode line disposed at one side of the second pixel unit facing away the first pixel unit are electrically connected through a second connection structure extending along an edge of the second pixel unit.

11. The dual-gate array substrate of claim 6, wherein a cutting groove is disposed between the second portion of the first strip structure and the first connection structure.

12. The dual-gate array substrate of claim 11, wherein a cutting groove is disposed between the first portion of the second strip structure and the second connection structure.

13. The dual-gate array substrate of claim 6, further comprising:
a third cross structure configured to electrically connect two adjacent common electrode lines between two adjacent rows of pixel units.

14. The dual-gate array substrate of claim 13, wherein the first strip structure, the second strip structure, the first connection structure, the second connection structure, the intermediate cross structure and the common electrode line are integrally formed in a same layer.

15. The dual-gate array substrate of claim 14, wherein the first cross structure, the second cross structure and the third cross structure are disposed in a same layer.

16. The dual-gate array substrate of claim 15, wherein the first strip structure, the second strip structure, the first connection structure, the second connection structure, the intermediate cross structure and the common electrode line are formed by using a metallic material.

17. The dual-gate array substrate of claim 15, wherein the first cross structure, the second cross structure and the third cross structure are formed by using indium tin oxide (ITO) material.

18. The dual-gate array substrate of claim 16, wherein the first cross structure, the second cross structure and the third cross structure are formed by using indium tin oxide (ITO) material.

19. A display panel, comprising the dual-gate array substrate of claim 1.

20. A display device, comprising the display panel of claim 19.

* * * * *